Sept. 18, 1973 H. GRAFF ET AL 3,759,798

METHOD OF PRODUCING ELECTRICALLY INSULATED ALUMINUM CONTACTS

Filed Jan. 28, 1970

United States Patent Office 3,759,798

Patented Sept. 18, 1973

3,759,798

METHOD OF PRODUCING ELECTRICALLY INSULATED ALUMINUM CONTACTS

Hans Grafe and Hans Ullrich, Munich, Germany, assignors to Siemens Aktiengesellschaft Filed Jan. 28, 1970, Ser. No. 6,357
Int. Cl. C23b *9/02, 5/48;* C23f *17/00*
U.S. Cl. 204—15 4 Claims

ABSTRACT OF THE DISCLOSURE

A method of producing electrically insulated aluminum contacts for planarly produced semiconductor device components comprises directly oxidizing an aluminum contact to form an insulating layer of aluminum oxide thereon.

DESCRIPTION OF THE INVENTION

The invention relates to a method of producing electrically insulated aluminum contacts. More particularly, the invention relates to a method of producing electrically insulated aluminum contacts for planarly produced semiconductor device components.

The aluminum contacts may be utilized as circuit paths, terminal wires and contact points for electrical components. It is very important in the planar manufacture of semiconductor device components that the contacts be provided at the electrodes and that they be insulated.

Although coats of lacquer or varnish are primarily utilized to insulate the contact wires of electrical components, the components of micro-electronic devices must be covered by vapor deposition and oxidation processes. Photolithographic or masking processes are utilized. The components of an integrated circuit are interconnected via the vapor deposition of aluminum metal circuit paths on an insulating oxide layer. The oxide layer also protects the components of the integrated circuit.

Considerable difficulties are encountered in providing a plurality of circuit paths for connecting individual components when the circuit paths intersect each other or are superimposed upon each other and are separated by only a layer of electrical insulation. The difficulties are encountered even when complex masking, oxidation or photo-etching processes are utilized. The difficulties often result in considerable variations of the electrical values and in electrical and mechanical breakdowns.

The aforedescribed difficulties are avoided by the method of the invention, which is utilized to produce electrically insulated aluminum contacts for planarly produced semiconductor device components such as circuit paths, terminal wires and contact points for electronic components. The method of the invention comprises directly oxidizing an aluminum contact to form an insulating layer of aluminum oxide thereon.

The localized oxidation process may be carried out with facility and inexpensively and permits the intersection of circuit paths in insulated relation, thereby avoiding tunnels and maintaining small dimensions for the components. Furthermore, the components of the electrical device provided by the method of the invention are of better quality than those of the devices produced by known methods involved in semiconductor manufacturing. The components of the device produced by the method of the invention also have a greater yield and longer lifespan, since the oxide layer on the surface of the aluminum contact provides excellent corrosion protection which is closely related to the contact path material. That is, the oxide layer prevents undesired junctions between circuit paths and encloses the material of the circuit paths. The aforedescribed advantages result in improved electrical stability and mechanical resistance of the devices produced by the method of the invention, as well as reduced production costs.

The principal object of the invention is to provide a new and improved method of producing electrically insulated aluminum contacts for planarly produced semiconductor device components.

An object of the invention is to provide a method of producing electrically insulated aluminum contacts which is inexpensive and efficient, effective and reliable.

An object of the invention is to provide a method of producing electrically insulated aluminum contacts, which contacts are of good quality, provide a greater yield and have a longer lifespan.

An object of the invention is to provide a method of producing electrically insulated aluminum contacts, which contacts are protected from corrosion and short-circuit with each other.

An object of the invention is to provide a method of producing electrically insulated aluminum contacts, which contacts have good electrical stability and good mechanical resistance.

In accordance with the invention, a method of producing electrically insulated aluminum contacts for planarly produced semiconductor device components comprises directly oxidizing an aluminum contact to form an insulating layer of aluminum oxide thereon.

The layer of aluminum oxide is additionally insulated with a layer of additional insulation. The layer of additional insulation may comprise either $SiO_2$ or $Si_3N_4$. The layer of $SiO_2$ may be formed on the layer of aluminum oxide by sputtering with energy-rich radiation.

The layer of $SiO_2$ or $Si_3N_4$ may be formed on the layer of aluminum oxide by pyrolysis of appropriate silanes.

The insulating layer of aluminum oxide may be formed by anodic oxidation. The anodic oxidation may utilize a weak organic acid such as, for example, a 3% oxalic acid solution, as the electrolyte and may utilize a graphite rod as the cathode. A direct voltage is applied during the anodic oxidation which corresponds to a current of about 15 milliamps per $cm.^2$. The anodic oxidation may be provided for a period of approximately 20 minutes.

The insulating layer of aluminum oxide may be formed by chemical oxidation. The chemical oxidation may utilize an alkali-chromate solution containing soda and heated to at least 90° C.

Another aluminum contact may be stacked on the layer of aluminum oxide and the other aluminum contact may be oxidized to form another insulating layer of aluminum oxide on the other aluminum contact. An area of the layer of aluminum oxide may be photo-etched to form specific geometric structures, prior to the stacking of the other aluminum contacts. The layer of aluminum oxide may be additionally insulated with a layer of $SiO_2$.

The method of the invention may be utilized to produce electrically insulated aluminum contacts for planarly produced integrated circuits, for semiconductor device components in a synthetic housing, or for thin film circuits including resistors and capacitors connected together in a multiple circuit.

The double insulation provided by the method of the invention is especially advantageous for special purposes, such as, for example, large area device components. The insulating layers provided by the method of the invention are especially homogeneous and of uniform construction. The adhesion of the aluminum to the surface of the semiconductor crystal is also improved.

The plurality of aluminum contacts and aluminum oxide insulating layers, which are stacked on each other in accordance with the method of the invention, may be removed by photo-etching and masking processes to provide specific geometrical configurations.

The method of the invention is particularly suited for producing integrated circuits, especially those produced planarly. The method of the invention is also advantageously utilized to produce semiconductor device components which are installed in a synthetic housing, by utilizing aluminum contact wires. This is of extreme importance when the synthetic housing is produced by a synthetic spray method, since contacting of the closely adjacent contact wires may be very easily effected by such method. The aluminum oxide insulating layer prevents short-circuits.

In order that the present invention may be readily carried into effect, it will now be described with reference to the accompanying drawing, wherein.

Figure 1:
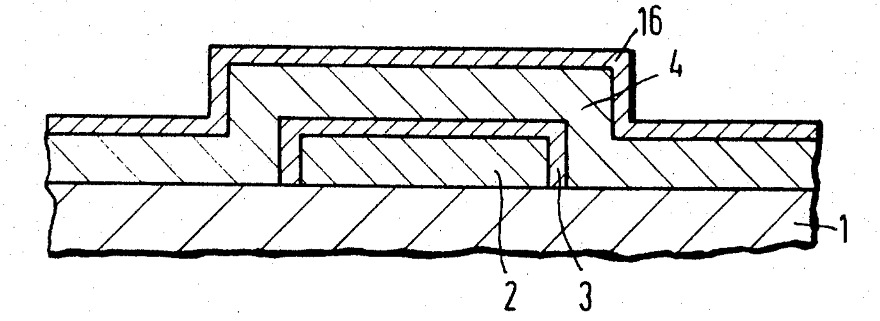
FIG. 1 is a sectional view of a component produced by an embodiment of the method of the invention.

FIG. 1 is a sectional view of a circuit path sequence which may basically be utilized to provide electrical contact with an integrated semiconductor circuit, for example. A semiconductor crystal body 1, which includes the semiconductor device components, is produced by precipitation. An aluminum layer 2, having a thickness of approximately 1 micron, is provided on the surface of the semiconductor crystal body 1 and functions as the lower circuit path. The aluminum layer 2 may be provided by vapor deposition in a vacuum of $4.10^{-5}$ torr, with the assistance of a vaporizing source (not shown in the figures) comprising a tungsten coil and an aluminum wire.

The surface areas of the aluminum layer 2 are converted into a layer 3 of aluminum oxide by anodic oxidation in a 3% oxalic acid solution. In the anodic oxidation process, the semiconductor crystal body 1 and the aluminum layer 2 are connected as an anode. A drop, blob or pearl of tin (not shown in the figures) is alloyed into the semiconductor crystal body 1 in an atmosphere of hydrogen chloride in order to conduct electricity. The tin drop is provided adjacent the aluminum layer 2. The semiconductor crystal body 1 may include a plurality of such arrangements, which are divided into the individual components, prior to mounting.

A thin wire is soldered to the tin drop and the semiconductor crystal body 1 is coated with pizein or photo-varnish, with the exception of the surface of the aluminum layer 2 to be oxidized. A graphite rod is utilized as the cathode.

The complete oxidation of the surface of the aluminum layer 2 is obtained at a current of 0.4 milliamp, which approximately corresponds to 15 milliamps per $cm.^2$ and 60 volts, after about 20 minutes. The resultant aluminum oxide layer 3 is then developed. Subsequently, the entire device is subjected to another vapor deposition process, in the aforedescribed manner, to produce the upper circuit path 4 of aluminum.

The aluminum oxide layer 3 (FIG. 1) mutually insulates the two circuit paths 2 and 4. In multi-layer circuits, that is, when more than two circuit paths are to be mutually insulated, the aforedescribed process is repeated. If electrical contact between the upper circuit path 4 of aluminum and the synthetic material of the housing (not shown in the figures) is to be prevented, an additional aluminum oxide layer 16 (FIG. 1) is provided on the surfaces of the aluminum layer 4.

Figure 2:
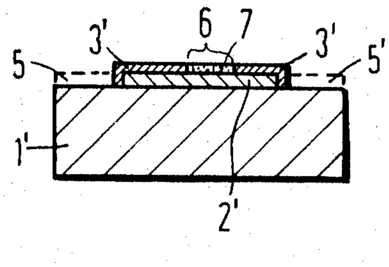
FIG. 2 is a sectional view illustrating a step in another embodiment of the method of the invention.
Figure 3:
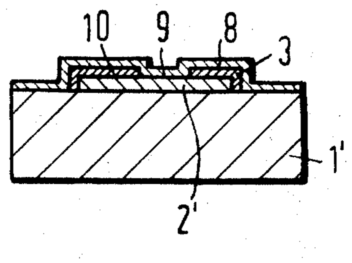
FIG. 3 is a sectional view illustrating another step in the embodiment of the method illustrated in FIG. 2.

FIGS. 2 and 3 illustrate another embodiment of the method of the invention. In the embodiment of FIGS. 2 and 3, in contrast with the embodiment of FIG. 1, a photo-etching process is utilized. As shown in FIG. 2, a semiconductor crystal body 1' has an aluminum layer 2' formed by vapor deposition on its entire surface area. The semiconductor crystal body 1' includes the areas required for the circuit (not shown). The aluminum layer 2' is removed in specified areas 5 and 5', indicated by broken lines, from the surface of the semiconductor crystal body 1' by a photo-etching process. As described with regard to FIG. 1, an aluminum oxide insulating layer 3' is provided on the surface areas of the aluminum layer 2' by anodic oxidation. Prior to the forming of the insulating layer 3' of aluminum oxide, a specific region or area 6 of the aluminum layer 2' is masked with photo-varnish 7, so that said aluminum oxide layer is not formed in said region.

FIG. 3 illustrates the semiconductor device component produced by the method of FIG. 2 after a second circuit path 8 is formed thereon by vapor deposition. As in FIG. 2, the semiconductor crystal body 1' has a first circuit path 2' of aluminum on the surface thereof and said first circuit path is partially covered by the insulating layer 3' of aluminum oxide. The second circuit path or aluminum layer 8 is in electrical contact, and forms a junction 9 with, the first circuit path or aluminum layer 2'. In the area 10, the first and second circuit paths 2' and 8 are electrically insulated from each other by the aluminum oxide layer 3'.

The surface of the second circuit path may be resubjected to a photo-etching process, and a specific circuit path structure may be produced thereby. It is equally feasible to produce an additional insulating layer of aluminum oxide.

Figure 4:
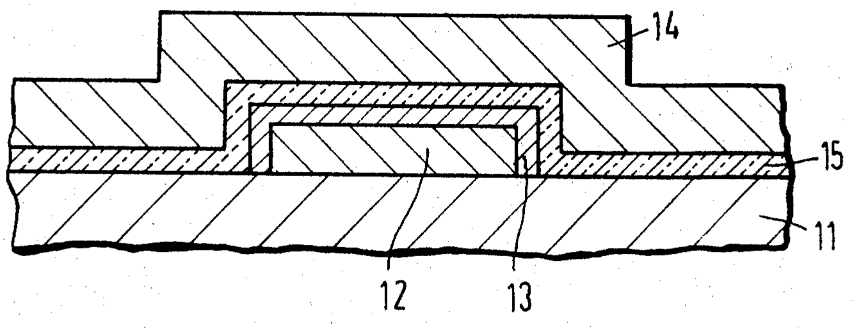
FIG. 4 is a sectional view illustrating a component produced by another embodiment of the method of the invention.

FIG. 4 illustrates a further development of the method of the invention, wherein the insulating layer of aluminum oxide between the circuit paths is provided with an additional insulating layer of $SiO_2$. In the embodiment of FIG. 4, a semiconductor crystal body 11 is provided with an aluminum layer 12 by vapor deposition. The aluminum layer 12 is provided either in selected surface areas or on the entire surface area of the semiconductor crystal body 11. The aluminum layer 12 has a thickness of 0.8 micron.

The aluminum layer 12 is subjected to anodic oxidation, thereby producing an aluminum oxide layer 13 on the surfaces of said aluminum layer. The thickness of the aluminum oxide layer 13 is 0.5 micron. The entire exposed surface area of the semiconductor crystal body 11 and the entire surface area of the aluminum oxide layer 13 are then provided with an additional insulating layer 15 of $SiO_2$.

The additional insulating layer 15 of $SiO_2$ may be provided by cathode sputtering or by pyrolysis of silanes such as, for example, tetraethoxysilane. The additional insulation layer 15 provides a double insulation between the circuit path 12 and an additional circuit path 14 produced by vapor deposition of aluminum, at a thickness of 0.8 micron, on the entire surface area of said additional insulation layer.

The circuit paths may be formed by a photo-etching process in the same manner as utilized in the embodiment of FIGS. 2 and 3.

While the invention has been described by means of specific examples and in specific embodiments, we do not wish to be limited thereto, for obvious modifications will occur to those skilled in the art without departing from the spirit and scope of the invention.

We claim:

1. In a method of producing semiconductor device components, by the planar method, the improvement comprising directly oxidizing at least one aluminum contact of said components to form an insulating layer of aluminum oxide thereon; and additionally insulating the layer of aluminum oxide with a layer of additional insulation.

2. In a method of producing semiconductor device components, by the planar method, the improvement comprising directly oxidizing at least one aluminum contact of said components to form an insulating layer of aluminum oxide thereon; and additionally insulating the layer of aluminum oxide with a layer of material from the group consisting of $SiO_2$ and $Si_3N_4$.

3. A method as claimed in claim 2, further comprising sputtering with energy-rich radiation to form a layer of $SiO_2$ on the layer of aluminum oxide as additional insulation.

4. In a method of producing semiconductor device components, by the planar method, the improvement comprising directly oxidizing at least one aluminum contact of said components to form an insulating layer of aluminum oxide thereon; and additionally pyrolyzing appropriate silanes to form a layer of material from the group consisting of $SiO_2$ and $Si_3N_4$ on the layer of aluminum oxide as additional insulation.

References Cited

UNITED STATES PATENTS

| | | | |
|---|---|---|---|
| 3,321,384 | 5/1967 | Wieder et al. | 204—38 A |
| 2,793,266 | 7/1961 | Berry | 204—38 A |
| 3,547,786 | 12/1970 | Rigo | 204—38 A |
| 3,469,294 | 9/1969 | Hayashi et al. | 204—38 A |
| 3,257,592 | 6/1966 | Maissel | 204—38 A |
| 3,256,468 | 6/1960 | Jenny et al. | 204—38 A |
| 3,113,256 | 12/1963 | Ishihawa et al. | 204—38 A |

JOHN H. MACK, Primary Examiner

R. L. ANDREWS, Assistant Examiner

U.S. Cl. X.R.

117—70 R; 204—38 A, 56 R, 58